United States Patent
Huang et al.

(10) Patent No.: US 8,841,733 B2
(45) Date of Patent: Sep. 23, 2014

(54) SEMICONDUCTOR DEVICE AND METHOD OF FABRICATING THE SAME

(75) Inventors: Hsin-Fu Huang, Tainan (TW); Kun-Hsien Lin, Miaoli County (TW); Chi-Mao Hsu, Tainan County (TW); Min-Chuan Tsai, Taipei County (TW); Tzung-Ying Lee, Pingtung County (TW); Chin-Fu Lin, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 317 days.

(21) Appl. No.: 13/109,599

(22) Filed: May 17, 2011

(65) Prior Publication Data

US 2012/0292721 A1 Nov. 22, 2012

(51) Int. Cl.
*H01L 29/78* (2006.01)
*H01L 21/28* (2006.01)
*H01L 29/66* (2006.01)
*H01L 29/49* (2006.01)
*H01L 29/51* (2006.01)

(52) U.S. Cl.
CPC .......... *H01L 29/78* (2013.01); *H01L 21/28088* (2013.01); *H01L 29/66545* (2013.01); *H01L 29/4966* (2013.01); *H01L 29/513* (2013.01); *H01L 29/517* (2013.01)
USPC .................... 257/412; 257/369; 257/E21.144

(58) Field of Classification Search
USPC .......... 257/369, 407, 410, 412, 388, E27.062, 257/E29.134, E21.144, E27.064, E21.464, 257/E21.453, E21.158
See application file for complete search history.

(56) References Cited

U.S. PATENT DOCUMENTS

| | | | |
|---|---|---|---|
| 5,719,446 A * | 2/1998 | Taguchi et al. | 257/751 |
| 5,956,612 A * | 9/1999 | Elliott et al. | 438/637 |
| 6,066,533 A | 5/2000 | Yu | |
| 6,177,351 B1 * | 1/2001 | Beratan et al. | 438/694 |
| 6,492,217 B1 | 12/2002 | Bai et al. | |
| 6,552,377 B1 | 4/2003 | Yu | |
| 6,696,345 B2 | 2/2004 | Chau et al. | |
| 6,756,302 B1 * | 6/2004 | Shan et al. | 438/653 |
| 7,074,664 B1 | 7/2006 | White et al. | |
| 7,109,079 B2 | 9/2006 | Schaeffer, III et al. | |
| 7,126,199 B2 | 10/2006 | Doczy et al. | |
| 7,381,619 B2 | 6/2008 | Wang et al. | |
| 7,488,656 B2 | 2/2009 | Cartier et al. | |
| 8,709,264 B2 * | 4/2014 | Jahnes et al. | 216/2 |
| 2002/0127888 A1 | 9/2002 | Cho et al. | |
| 2004/0183072 A1 * | 9/2004 | Kim et al. | 257/59 |
| 2005/0095763 A1 | 5/2005 | Samavedam et al. | |
| 2005/0275035 A1 | 12/2005 | Mathew et al. | |
| 2006/0017098 A1 * | 1/2006 | Doczy et al. | 257/330 |
| 2006/0040482 A1 | 2/2006 | Yang et al. | |
| 2007/0082445 A1 | 4/2007 | Yang et al. | |

(Continued)

*Primary Examiner* — Cuong Q Nguyen
*Assistant Examiner* — Yosef Gebreyesus
(74) *Attorney, Agent, or Firm* — J.C. Patents

(57) ABSTRACT

A method of fabricating a semiconductor device includes following steps. A substrate is provided, wherein a first dielectric layer having a trench therein is formed on the substrate, a source/drain region is formed in the substrate at two sides of the trench, and a second dielectric layer is formed on the substrate in the trench. A first physical vapor deposition process is performed to form a Ti-containing metal layer in the trench. A second physical vapor deposition process is performed to form an Al layer on the Ti-containing metal layer in the trench. A thermal process is performed to anneal the Ti-containing metal layer and the Al layer so as to form a work function metal layer. A metal layer is formed to fill the trench.

4 Claims, 6 Drawing Sheets

(56) References Cited

U.S. PATENT DOCUMENTS

| | | |
|---|---|---|
| 2007/0148838 A1 | 6/2007 | Doris et al. |
| 2007/0152283 A1* | 7/2007 | Baik et al. ............ 257/411 |
| 2007/0210354 A1 | 9/2007 | Nabatame et al. |
| 2008/0318371 A1 | 12/2008 | Lin et al. |
| 2009/0057787 A1 | 3/2009 | Matsuki et al. |
| 2010/0052074 A1 | 3/2010 | Lin et al. |
| 2010/0068877 A1 | 3/2010 | Yeh et al. |
| 2010/0081262 A1* | 4/2010 | Lim et al. ............ 438/479 |

* cited by examiner

SEMICONDUCTOR DEVICE AND METHOD OF FABRICATING THE SAME

BACKGROUND OF THE INVENTION

1. Field of the Invention

The present invention relates to a semiconductor device and a method of fabricating the same. More particularly, the present invention relates to a semiconductor device having a metal gate and a method of fabricating the same.

2. Description of Related Art

With the continual miniaturization of semiconductor devices, sizes of gate structures are also gradually reduced. Therefore, the thickness of gate dielectric layers also needs to be reduced to prevent the performance of the devices from being affected. Generally, the material of the gate dielectric layers usually includes silicon oxide. However, the leakage current phenomenon frequently occurs when reducing the thickness of the gate dielectric layers adopting silicon oxide.

In order to reduce the occurrence of leakage current, the conventional method is to replace silicon oxide with high dielectric constant (high k) material for the gate dielectric layers. When applying high dielectric constant material as the gate dielectric layers, the gates adopting polysilicon then react with high dielectric constant material to generate Fermi-level pinning, thereby resulting in an increase in the threshold voltage so as to affect the performance of the device.

In one of the conventional techniques, the metal layer is applied as the gate, that is, the work function metal layer known in the art, to prevent the threshold voltage from increasing and therefore reducing the resistance of the device.

However, conventional semiconductor devices have a difficulty in lowering the band-edge work function, and therefore the semiconductor devices with superior electrical characteristics can not be provided.

SUMMARY OF THE INVENTION

The present invention is directed to a method of fabricating a semiconductor device, and thereby the band-edge work function of the semiconductor device can be effectively lowered.

The present invention is further directed to a semiconductor device with superior electrical characteristics.

The present invention provides a method of fabricating a semiconductor device that includes the following steps. A substrate is provided, wherein a first dielectric layer having a trench therein is formed on the substrate, a source/drain region is formed in the substrate at two sides of the trench, and a second dielectric layer is formed on the substrate in the trench. A first physical vapor deposition process is performed to form a Ti-containing metal layer in the trench. A second physical vapor deposition process is performed to form an Al layer on the Ti-containing metal layer in the trench. A thermal process is performed to anneal the Ti-containing metal layer and the Al layer so as to form a work function metal layer. A metal layer is formed to fill the trench.

According to an embodiment of the present invention, in the method of fabricating the semiconductor device, the second dielectric layer is formed before the first dielectric layer is formed or after the trench in the first dielectric layer is formed, for example.

According to an embodiment of the present invention, in the method of fabricating the semiconductor device, a material of the second dielectric layer is a high dielectric constant material, for example.

According to an embodiment of the present invention, in the method of fabricating the semiconductor device, the Ti-containing metal layer is a TiAl layer or a Ti layer, for example.

According to an embodiment of the present invention, in the method of fabricating the semiconductor device, a ratio of Ti to Al in a target used to form the TiAl layer is from 1:1 to 1:3, for example.

According to an embodiment of the present invention, in the method of fabricating the semiconductor device, the first physical vapor deposition process is a radio frequency/direct current physical vapor deposition (RF/DC-PVD) process, for example.

According to an embodiment of the present invention, in the method of fabricating the semiconductor device, a temperature of the thermal process is from 200° C. to 500° C., for example.

According to an embodiment of the present invention, in the method of fabricating the semiconductor device, a conducting time of the thermal process is from 2 min to 10 min, for example.

According to an embodiment of the present invention, in the method of fabricating the semiconductor device, the thermal process, the first physical vapor deposition process and the second physical vapor deposition process are performed in situ, for example.

According to an embodiment of the present invention, the method of fabricating the semiconductor device further includes forming an interfacial layer on the substrate in the trench before the second dielectric layer is formed.

According to an embodiment of the present invention, the method of fabricating the semiconductor device further includes forming a barrier layer on the second dielectric layer before the Ti-containing metal layer is formed.

According to an embodiment of the present invention, the method of fabricating the semiconductor device further includes forming a spacer on the substrate at the two sides of the trench before the first dielectric layer is formed.

According to an embodiment of the present invention, in the method of fabricating the semiconductor device, the Ti-containing metal layer has a thickness ranging from 2 nm to 10 nm, for example.

According to an embodiment of the present invention, in the method of fabricating the semiconductor device, the Al layer has a thickness ranging from 3 nm to 10 nm, for example.

The present invention further provides a semiconductor device including a substrate, a gate structure, a second dielectric layer and a source/drain region. A first dielectric layer is disposed on the substrate, and the first dielectric layer has a trench therein. The gate structure is disposed on the substrate in the trench and includes a work function metal layer and a metal layer. The work function metal layer is disposed in the trench, and includes a $TiAl_3$ phase metal layer. The metal layer fills the trench. The second dielectric layer is disposed between the gate structure and the substrate. The source/drain region is disposed in the substrate at two sides of the gate structure.

According to an embodiment of the present invention, in the semiconductor device, the work function metal layer includes a Ti-containing metal layer, the $TiAl_3$ phase metal layer and an Al metal layer. The $TiAl_3$ phase metal layer is disposed on the Ti-containing metal layer. The Al metal layer is disposed on the $TiAl_3$ phase metal layer.

According to an embodiment of the present invention, in the semiconductor device, the work function metal layer includes a Ti-containing metal layer and the TiAl$_3$ phase metal layer. The TiAl$_3$ phase metal layer is disposed on the Ti-containing metal layer.

According to an embodiment of the present invention, in the semiconductor device, the work function metal layer includes the TiAl$_3$ phase metal layer and an Al metal layer. The Al metal layer is disposed on the TiAl$_3$ phase metal layer.

According to an embodiment of the present invention, in the semiconductor device, the Ti-containing metal layer is a TiAl layer or a Ti layer, for example.

According to an embodiment of the present invention, in the semiconductor device, a material of the second dielectric layer is a high dielectric constant material, for example.

According to one embodiment of the present invention, the semiconductor device further includes an interfacial layer disposed between the substrate and the second dielectric layer.

According to one embodiment of the present invention, the semiconductor device further includes a barrier layer disposed between the second dielectric layer and the gate structure.

According to one embodiment of the present invention, the semiconductor device further includes a spacer disposed on a sidewall of the gate structure.

Based on the above, in the method of fabricating the semiconductor device of the present invention, the work function metal layer is formed by performing the thermal process to anneal the Ti-containing metal layer and the Al layer formed by the physical vapor deposition processes, and therefore the band-edge work function of the semiconductor device can be effectively lowered.

Furthermore, in the semiconductor device of the present invention, the work function metal layer includes the TiAl$_3$ phase metal layer, and therefore the semiconductor device has superior electrical characteristics.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A to 1D are schematic cross-sectional views of a fabricating process of a semiconductor device according to an embodiment of the present invention FIGS. 2A to 2D are partial sectional views of various work function metal layers. It should be noted that the method of fabricating the semiconductor device described in the following adopts a fabricating process of an N-type metal oxide semiconductor (NMOS) device for illustration. People skilled in the art should be able to embody the invention based on the illustration, whereas the scope of the invention is not limited thereto. Moreover, the disposition locations, the manners of formation, and the orders of other components such as gate structures, doped regions, spacers, contact etch stop layers, and the like are all fabricated with techniques known to people skilled in the art based on conventional arts, and are not limited to the descriptions illustrated the following embodiments.

Figure 1A:
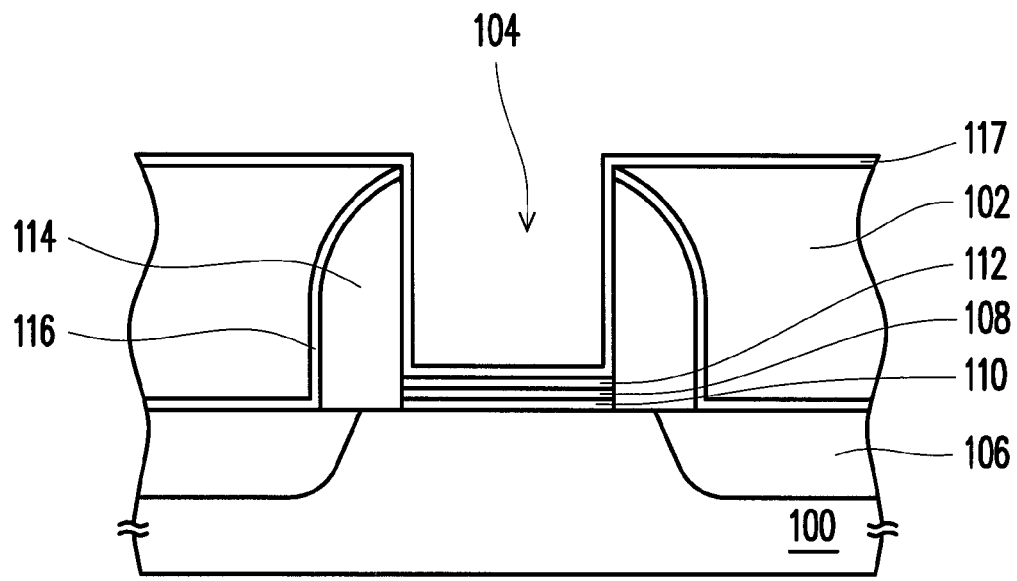
FIGS. 1A to 1D are schematic cross-sectional views of a fabricating process of a semiconductor device according to an embodiment of the present invention.

Referring to FIG. 1A, a substrate 100 is provided, wherein a first dielectric layer 102 having a trench 104 therein is formed on the substrate 100, a source/drain region 106 is formed in the substrate 100 at two sides of the trench 104, and a second dielectric layer 108 is formed on the substrate 100 in the trench 104. The substrate 100 is, for example, a semiconductor substrate such as a silicon substrate.

It should be noted that the method of fabricating the first dielectric layer 102, the trench 104 in the first dielectric layer 102, the source/drain region 106, and the second dielectric layer 108 are described for illustration and a scope of the present invention is not limited thereto.

In the present embodiment, the first dielectric layer 102 and the trench 104 disposed therein are fabricated by the following steps. A dummy gate adopting polysilicon (not shown) is formed on the substrate 100, and then the first dielectric layer 102 exposing the dummy gate is formed by a chemical vapor deposition (CVD) process and a chemical mechanical polishing (CMP) process. After that, the dummy gate is removed and the trench 104 is formed in the first dielectric layer 102. The material of the first dielectric layer 102 is, for example, silicon oxide or composite layer of different dielectric materials.

The source/drain region 106 can be formed by performing an ion implantation process after the formation of the dummy gate and before the formation of the first dielectric layer 102. In detail, types, concentrations and depths of the dopants used to form the source/drain region 106 may be adjusted by people skilled in the art based on demands.

Particularly, the second dielectric layer 108 can be formed before the formation of the first dielectric layer 102 or after the formation of the trench 104 in the first dielectric layer 102. The present embodiment takes the second dielectric layer 108 formed before the formation of the first dielectric layer 102 as an example for illustration, and therefore the second dielectric layer 108 is substantially shaped as "-". The material of the second dielectric layer 108 is, for example, a high dielectric constant (high-k) material. The high dielectric constant material is, for example, a dielectric material with a dielectric constant greater than 4, such as La$_2$O$_3$, AlO, ZrO$_2$, TiO, Ta$_2$O$_5$, Y$_2$O$_3$, SrTiO$_3$(STO), BaTiO$_3$(BTO), BaZrO, HfZrO, HfZrON, HfLaO, HfSiO, HfSiON, LaSiO, AlSiO, HfTaO, HfTiO, (Ba,Sr)TiO$_3$(BST), Al$_2$O$_3$, Si$_3$N$_4$, oxynitrides, or a combination thereof. The method of forming the second dielectric layer 108 is an atomic layer deposition (ALD) process, a chemical vapor deposition (CVD) process, a metal-organic CVD (MOCVD) process, a physical vapor deposition (PVD) process, a thermal oxidation process, or a combination thereof.

In addition, in the fabrication of the semiconductor device, an interfacial layer 110, a barrier layer 112, a spacer 114, a contact etch stop layer (CESL) 116 or the combination thereof can be selectively formed, which are all fabricated with techniques known to people skilled in the art based on conventional arts, and therefore they are only described briefly and the scope of the invention is not limited thereto.

In addition, before the formation of the second dielectric layer 108, the interfacial layer 110 may be selectively formed on the substrate 100 in the trench 104. The material of the interfacial layer 110 is silicon oxide, for example. The method of forming the interfacial layer 110 is an atomic layer deposition process, a chemical vapor deposition process, a physical vapor deposition process, a thermal oxidation process, or a combination thereof.

After the second dielectric layer 108 is formed and before the Ti-containing metal layer is subsequently formed, the barrier layer 112 can be selectively formed on the second dielectric layer 108, thereby eliminating Fermi-level pinning generated between the polysilicon dummy gate and the second dielectric layer 108. In addition, the barrier layer 112 may be used as an etch barrier layer when removing the dummy gate. Moreover, the barrier layer 112 can be also used as a diffusion barrier layer to protect the second dielectric layer 108. The material of the barrier layer 112 is TaN or TiN, for example. The method of forming the barrier layer 112 includes an atomic layer deposition process, a chemical vapor deposition process, or a physical vapor deposition process, for example.

Furthermore, after the dummy gate is formed and before the first dielectric layer 102 is formed, the spacer 114 can be selectively formed on the substrate 100 at two sides of the trench 104. The material of the spacer 114 is silicon oxide, silicon nitride, or silicon oxynitride, for example. In a method of forming the spacer 114, a spacer material layer (not illustrated) is first formed on the substrate 100 by the CVD process, and then a portion of the spacer material layer is removed by an etching back process.

After the spacer 114 is formed and before the first dielectric layer 102 is formed, the contact etch stop layer 116 can be selectively formed on the substrate 100. The material of the contact etch stop layer 116 is, for example, silicon nitride, compressive or tensile silicon nitride, or silicon nitride having an underlying silicon oxide pad layer. The method of forming the contact etch stop layer 116 is a chemical vapor deposition process, for example.

It is mentioned that, when the NMOS device of the embodiment is integrated into the fabrication process of CMOS device, a work function metal layer of TiN is formed in the PMOS device (not shown), and the work function metal layer of TiN is also formed in the NMOS device. Meanwhile, the fabrication process of the NMOS device of the embodiment can further include forming an etching stop layer 117 in the trench 104, and therefore the work function metal layer of TiN can be formed on the etching stop layer 117. As such, the etching stop layer 117 can be used as an etching stop layer in the etching process for removing the work function metal layer of TiN in the NMOS device. The material of the etching stop layer 117 is TaN, for example.

Figure 1B:
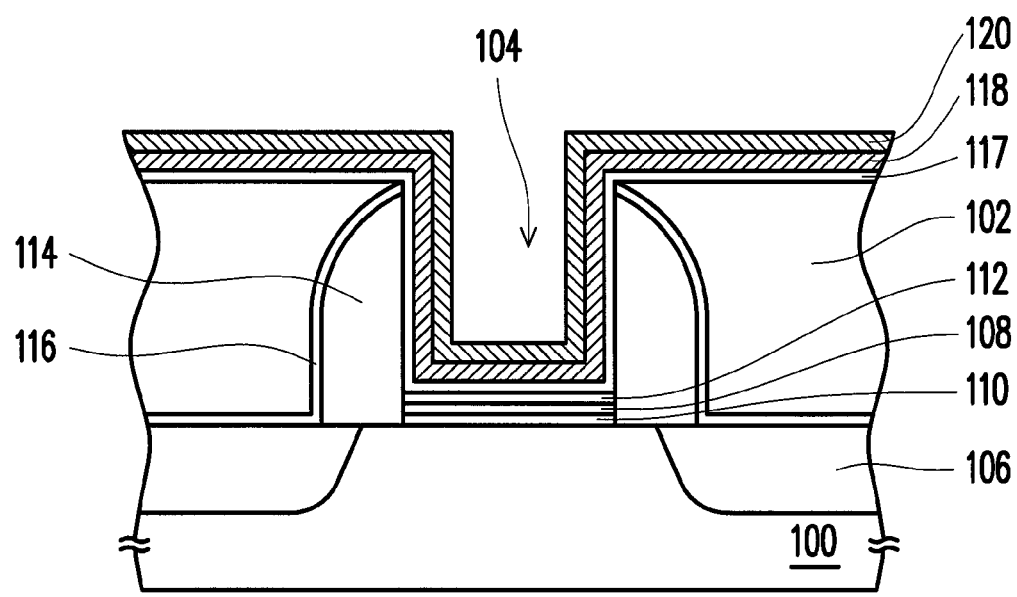

Referring to FIG. 1B, next, a first physical vapor deposition process is performed to form a Ti-containing metal layer 118 on the etching stop layer 117 in the trench 104. The Ti-containing metal layer 118 is a TiAl layer or a Ti layer, for example. In this embodiment, a thickness of the Ti-containing metal layer 118 is from 2 nm to 10 nm, for example. The ratio of Ti to Al in a target used to form the TiAl layer can be from 1:1 to 1:3. The first physical vapor deposition process can be a radio frequency/direct current physical vapor deposition process, thereby reducing the damage to layer caused by plasma.

Then, a second physical vapor deposition process is performed to form an Al layer 120 on the Ti-containing metal layer 118 in the trench 104. In this embodiment, a thickness of the Al layer 120 is from 3 nm to 10 nm, for example. In addition, the second physical vapor deposition process for forming the Al layer 120 can be a cold process. For example, by disposing the substrate 100 on the carrier having cooling function, the substrate 100 can be maintained in a low temperature during the second physical vapor deposition process. The temperature of the cold process is about room temperature or a little bit higher than room temperature, for example.

Referring to 1C, thereafter, a thermal process is performed to anneal the Ti-containing metal layer 118 and the Al layer 120, thereby forming a work function metal layer 122. The temperature of the thermal process is, for example, from 200° C. to 500° C. such as 460° C. The conducting time of the thermal process is from 2 min to 10 min for example. Particularly, the thermal process, the first physical vapor deposition process and the second physical vapor deposition process can be performed in situ, in different reaction chambers of the cluster tool, or by any other processes in which the vacuum is not be broken.

Furthermore, referring to FIGS. 1C and 2A to 2D, in the thermal process, the Ti-containing metal layer 118 and the Al layer 120 react with each other by annealing so as to form a TiAl$_3$ phase metal layer 124, and therefore the work function metal layer 122 includes the TiAl$_3$ phase metal layer 124. The structure of the work function metal layer 122 can have various configurations according to extent of reaction between and ratio between thickness of the Ti-containing metal layer 118 and the Al layer 120.

Figure 2A:
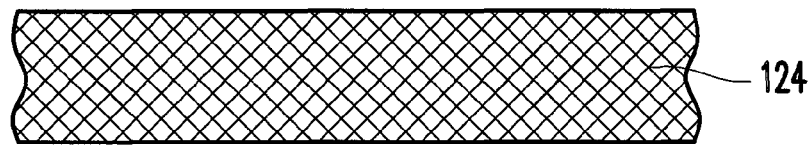
FIGS. 2A to 2D are partial sectional views of various work function metal layers.

Referring to FIG. 2A, when the Ti-containing metal layer 118 and the Al layer 120 react with each other completely, the work function metal layer 122 can be a single layer of the TiAl$_3$ phase metal layer 124.

Figure 2B:
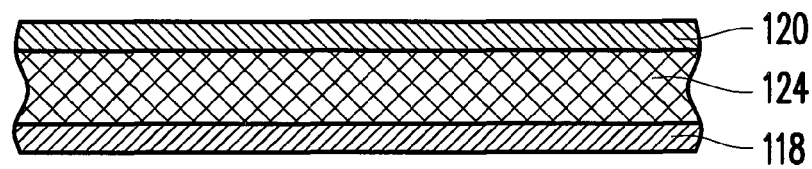

Referring to FIG. 2B, when the Ti-containing metal layer 118 and the Al layer 120 do not react with each other completely and a portion of the Ti-containing metal layer 118 and a portion of the Al layer 120 are remained, the work function metal layer 122 includes the Ti-containing metal layer 118, the TiAl$_3$ phase metal layer 124 and the Al metal layer 120. In the present embodiment, the TiAl$_3$ phase metal layer 124 is disposed on the Ti-containing metal layer 118. The Al metal layer 120 is disposed on the TiAl$_3$ phase metal layer 124.

Figure 2C:
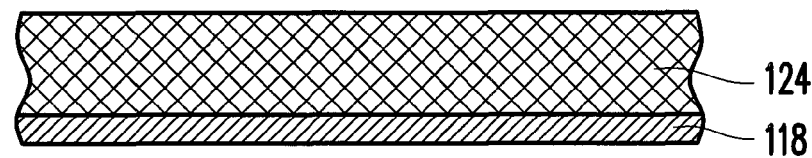

Referring to FIG. 2C, when the Ti-containing metal layer 118 and the Al layer 120 do not react with each other completely and a portion of the Ti-containing metal layer 118 is remained, the work function metal layer 122 includes the Ti-containing metal layer 118 and the TiAl$_3$ phase metal layer 124. In the present embodiment, the TiAl$_3$ phase metal layer 124 is disposed on the Ti-containing metal layer 118.

Figure 2D:
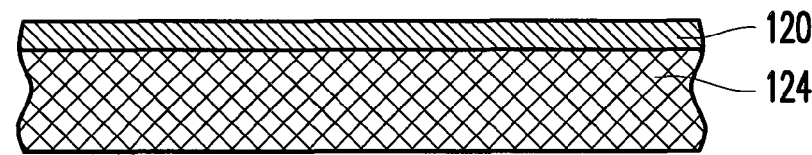

Referring to FIG. 2D, when the Ti-containing metal layer 118 and the Al layer 120 do not react with each other completely and a portion of the Al layer 120 is remained, the work function metal layer 122 includes TiAl$_3$ phase metal layer 124 and the Al metal layer 120. In the present embodiment, the Al metal layer 120 is disposed on the TiAl$_3$ phase metal layer 124.

Figure 1C:
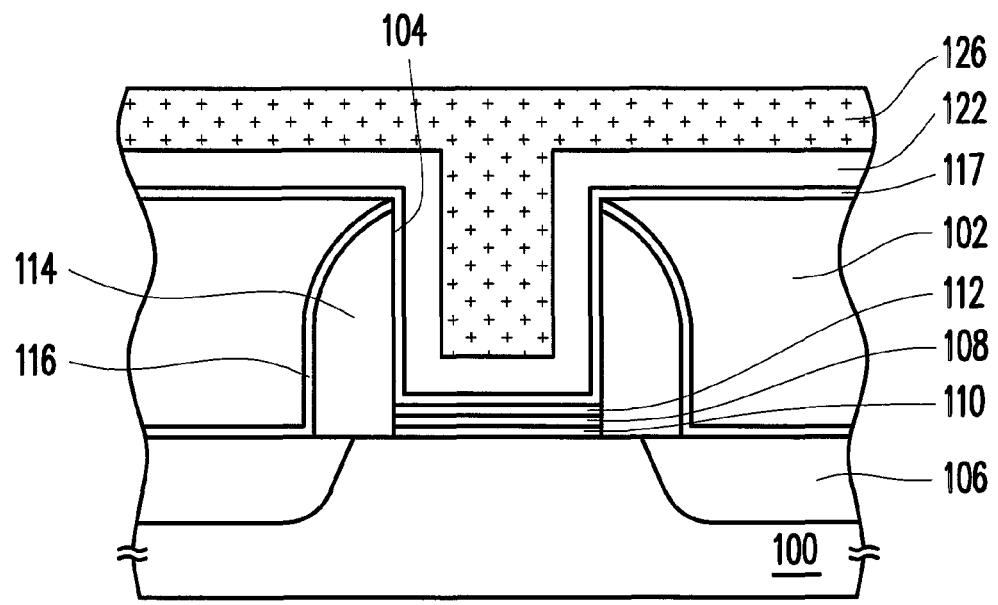

Referring to FIG. 1C, a metal material layer 126 is then formed on the work function metal layer 122, wherein the metal material layer 126 fills the trench 104. The material of the metal material layer 126 is, for example, a low resistance metal such as Al. The method of forming the metal material layer 126 is a PVD process, for example.

Figure 1D:
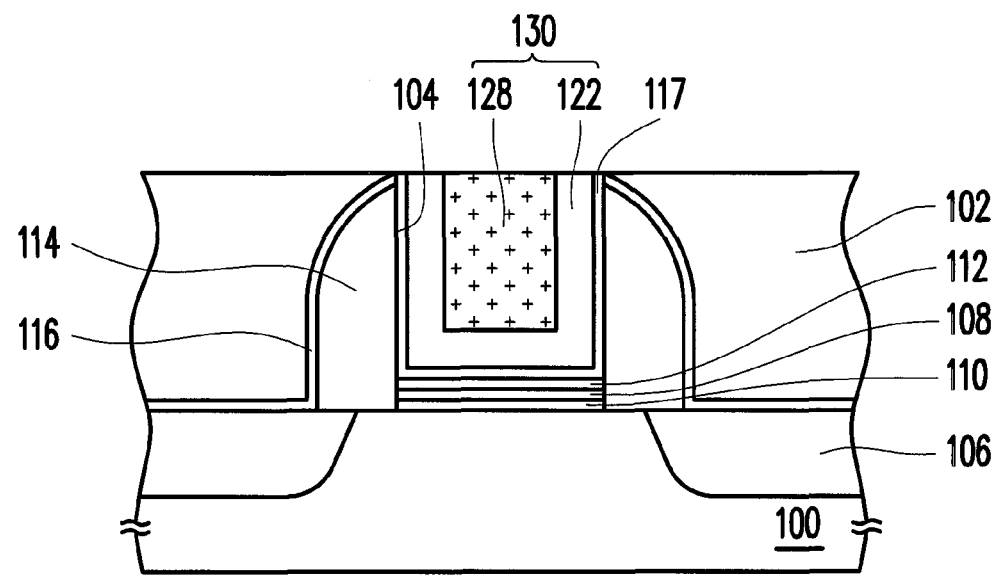

Referring to FIG. 1D, a CMP process is performed to remove the metal material layer 126 outside the trench 104, so as to form a metal layer 128 filling the trench 104. However, the method of forming the metal layer 128 is not limited to the scope of the foresaid method. In addition, the CMP process can remove the work function metal layer 122 and the etching stop layer 117 outside the trench 104 concurrently, and thus only the work function metal layer 122 and the etching stop layer 117 disposed in the trench 104 is remained. After the CMP process is finished, a gate structure 130 including the work function metal layer 122 and the metal layer 128 may be formed in the trench 104.

According to the above embodiments, the work function metal layer 122 is formed by performing the thermal process to anneal the Ti-containing metal layer 118 and the Al layer 120 formed by the physical vapor deposition process, and thus the band-edge work function of the semiconductor device can be effectively lowered.

FIGS. 3A to 3D are schematic cross-sectional views of a fabricating process of a semiconductor device according to another embodiment of the present invention. It is noted that the process illustrated in FIGS. 3A to 3D is performed on the structure of FIG. 1B. The identical numbers in FIGS. 1B and 3A refer to the identical components, and detailed description thereof is omitted herein.

Figure 3A:
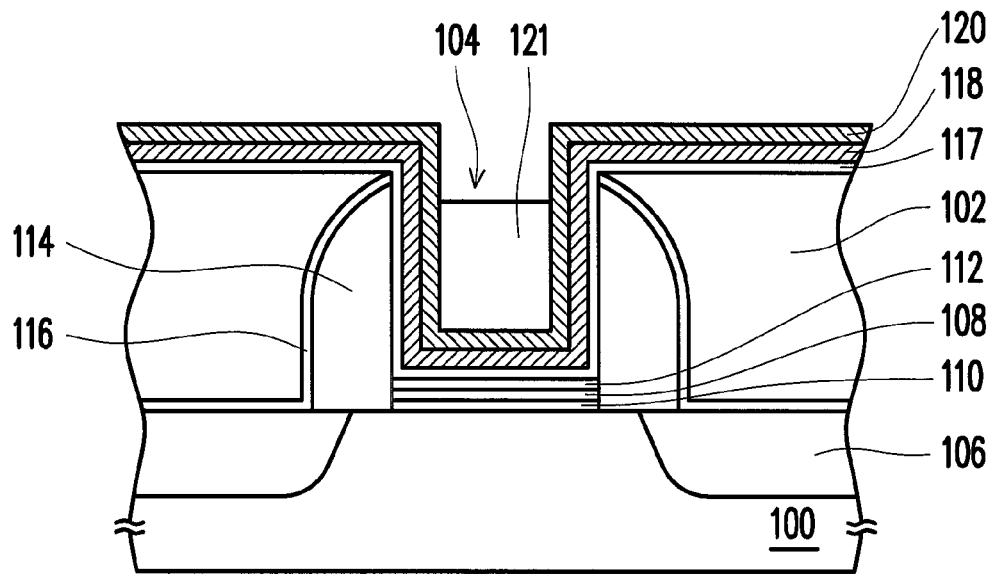
FIGS. 3A to 3D are schematic cross-sectional views of a fabricating process of a semiconductor device according to another embodiment of the present invention.

Referring to FIG. 3A, first, a photoresist layer 121 is formed in the trench 104 of the structure of FIG. 1B, and the top surface of the photoresist layer 121 is lower than the top surface of the first dielectric layer 102, for example.

Figure 3B:
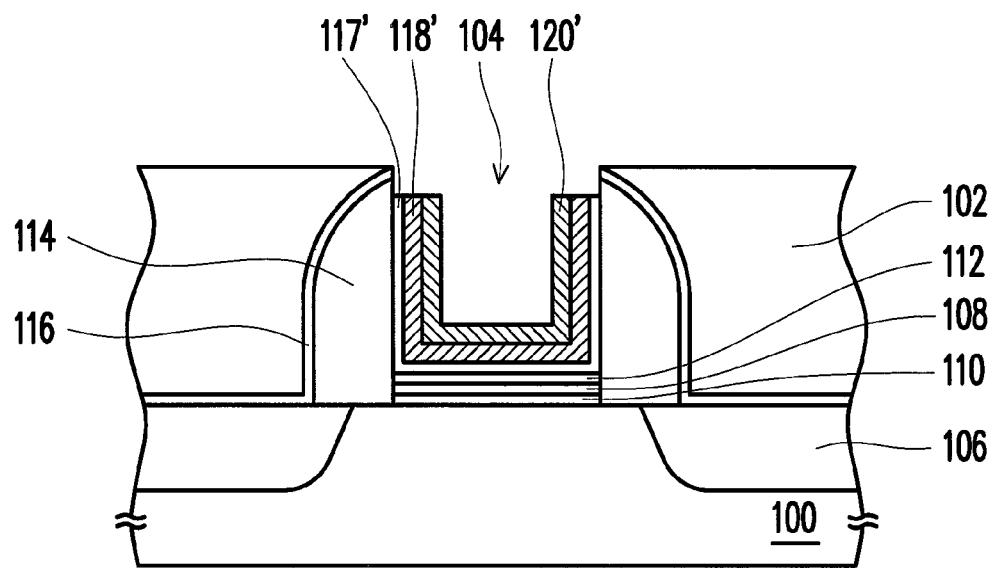

Referring to FIG. 3B, then, a portion of the Al layer 120 and a portion of the Ti-containing metal layer 118 exposed by the photoresist layer 121 are removed, thereby forming an Al layer 120' and a Ti-containing metal layer 118' in the trench 104. In addition, the etching stop layer 117 exposed by the photoresist layer 121 can be also removed in this step, thereby forming an etching stop layer 117' in the trench 104. As such, the height of the Al layer 120', the Ti-containing metal layer 118', and the etching stop layer 117' disposed on the sidewall of the trench 104 is lower than the height of the top surface of the first dielectric layer 102. The method of partially removing the Al layer 120, the Ti-containing metal layer 118, and the etching stop layer 117 is an etching back process, for example.

Next, the photoresist layer 121 is removed. The method of removing the photoresist layer 121 is, for example, a dry photoresist stripping process or a wet photoresist stripping process.

Figure 3C:
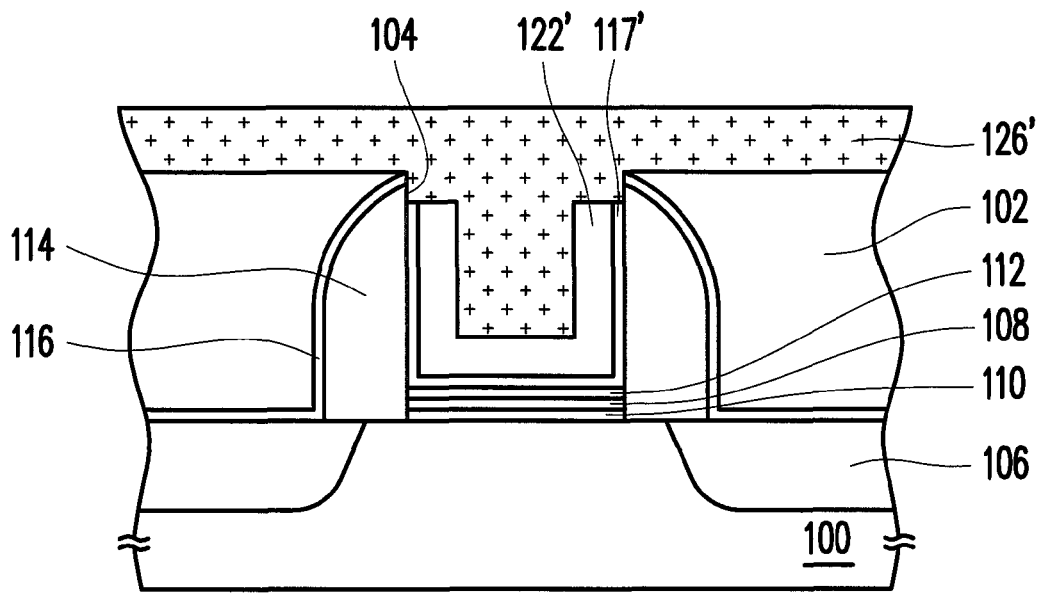

Referring to FIG. 3C, afterwards, a thermal process is performed to anneal the Ti-containing metal layer 118' and the Al layer 120', thereby forming a work function metal layer 122'. The forming method, process condition, and the constitution method of the work function metal layer 122' are similar to those of the work function metal layer 122. Hence, a detailed description thereof is omitted.

Then, a metal material layer 126' is formed on the work function metal layer 122', wherein the metal material layer 126' fills the trench 104. The material of the metal material layer 126' is, for example, a low resistance metal such as Al. The method of forming the metal material layer 126' is a PVD process, for example.

Figure 3D:
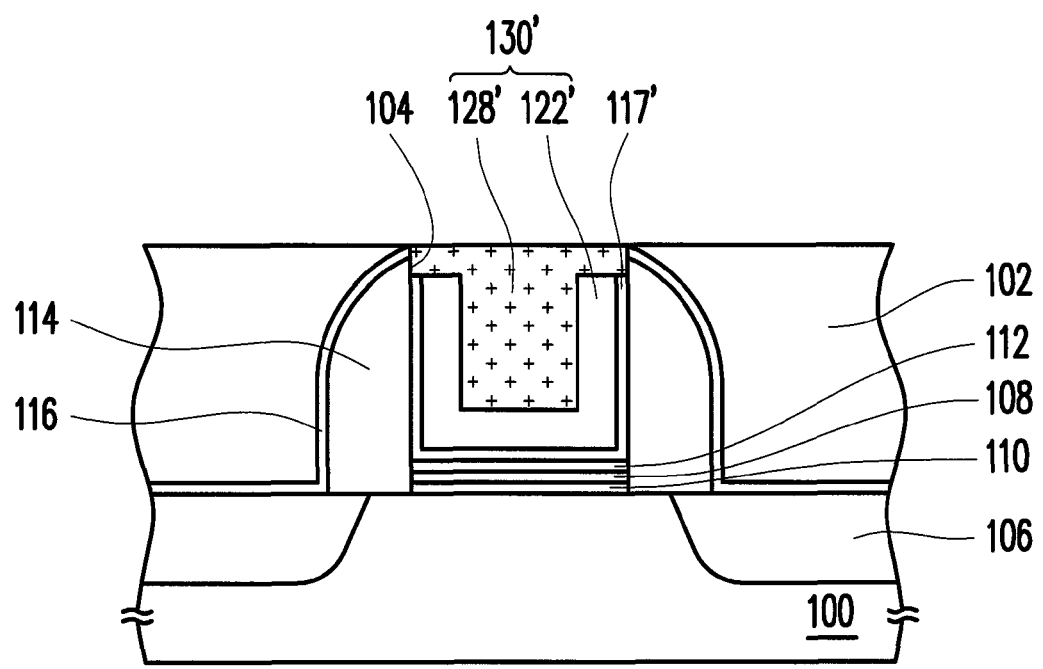

Referring to FIG. 3D, a CMP process is performed to remove the metal material layer 126' outside the trench 104, so as to form a metal layer 128' filling the trench 104. However, the method of forming the metal layer 128' is not limited to the scope of the foresaid method. After the CMP process is finished, a gate structure 130' including the work function metal layer 122' and the metal layer 128' may be formed in the trench 104.

According to the above embodiments, the work function metal layer 122' is formed by performing the thermal process to anneal the Ti-containing metal layer 118' and the Al layer 120' formed by the physical vapor deposition process, and thus the band-edge work function of the semiconductor device can be effectively lowered.

Herein, the semiconductor device of the present embodiment is described with reference to FIGS. 1D and 3D.

Referring to FIG. 1D, the semiconductor device 100 includes the substrate 100, the gate structure 130, the second dielectric layer 108 and the source/drain region 106. The first dielectric layer 102 is disposed on the substrate 100, and the first dielectric layer 102 has the trench 104 therein. The gate structure 130 is disposed on the substrate 100 in the trench 104 and includes a work function metal layer 122 and a metal layer 128. The work function metal layer 122 is disposed in the trench 104, and includes a $TiAl_3$ phase metal layer 124 as shown in FIGS. 2A to 2D. The metal layer 128 fills the trench 104. The second dielectric layer 108 is disposed between the gate structure 130 and the substrate 100. The source/drain region 106 is disposed in the substrate 100 at two sides of the gate structure 130. In addition, the semiconductor device can selectively include the interfacial layer 110, the barrier layer 112, the spacer 114, the contact etch stop layer 116, the etching stop layer 117 or the combination thereof. In detail, the interfacial layer 110 is disposed between the substrate 100 and the second dielectric layer 108. The barrier layer 112 is disposed between the second dielectric layer 108 and the gate structure 130. The spacer 114 is disposed on a sidewall of the gate structure 130. The contact etching stop layer 116 covers the spacer 114 and a portion of the substrate 100. The etching stop layer 117 is disposed in the trench 104, and the work function metal layer 122 is disposed on the etching stop layer 117. It is noted that the material, the forming method and the efficacy of each component in the semiconductor device are described in details in the above embodiments. Hence, a detailed description thereof is omitted.

Moreover, it is mentioned that the difference between the semiconductor devices of FIGS. 3D and 1D is that the height of the work function metal layer 122' disposed on the sidewall of the trench 104 is lower than the height of the top surface of the first dielectric layer 102, and the metal layer 128' is substantially shaped as "T".

Based on the above embodiments, the work function metal layers 122 and 122' include the $TiAl_3$ phase metal layer 124, and thus the semiconductor device has superior electrical characteristics.

Figure 4:
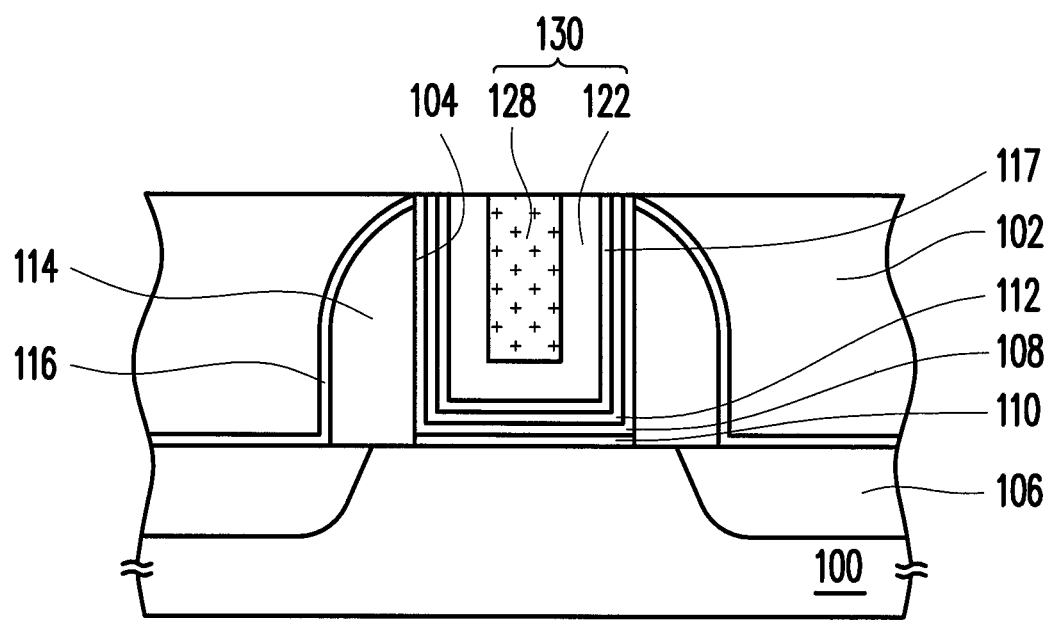
FIG. 4 is a schematic cross-sectional view of a semiconductor device according to another embodiment of the present invention.

FIG. 4 is a schematic cross-sectional view of a semiconductor device according to another embodiment of the present invention.

The major difference between the semiconductor devices in FIG. 4 and FIG. 1D relies in that the second dielectric layer 108 and the barrier layer 112 in FIG. 1D are substantially shaped as "-", and the second dielectric layer 108' and the barrier layer 112' in FIG. 4 are substantially shaped as "U". This difference results from that the second dielectric layer 108 and the barrier layer 112 in FIG. 1D are formed before the formation of the first dielectric layer 102 and the second dielectric layer 108' and the barrier layer 112' in FIG. 4 are formed after the formation of the trench 104 in the first dielectric layer 102. The same reference numerals used in FIGS. 3 and 1D are used to refer to the same elements, and thus a detailed description thereof is omitted.

Similarly, the work function metal layer 122 in FIG. 4 includes the $TiAl_3$ phase metal layer 124, and thus the semiconductor device has superior electrical characteristics.

In addition, reference with the above embodiments, one of the ordinary skill in the art can speculate that the second dielectric layer 108' and the barrier layer 112' substantially shaped as "U" in FIG. 4 can be applied to the structure of FIG. 3D, and a detailed description thereof is omitted.

In summary, the above embodiments have at least the following advantages:

1. By the method of fabricating the semiconductor device in the above embodiments, the band-edge work function of the semiconductor device can be effectively lowered.

The semiconductor devices in the above embodiments have superior electrical characteristics.

2. Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor device, comprising:
    a substrate, having a first dielectric layer thereon, wherein the first dielectric layer has a trench therein;
    a gate structure, disposed on the substrate in the trench and comprising:
    a work function metal layer, disposed in the trench, and comprising a $TiAl_3$ phase metal layer and an Al metal layer disposed on the $TiAl_3$ phase metal layer, wherein the Al layer has a thickness ranging from 3 nm to 10 nm; and
    a metal layer filling the trench;
    a second dielectric layer, disposed between the gate structure and the substrate; and
    a source/drain region, disposed in the substrate at two sides of the gate structure.

2. A semiconductor device, comprising:
    a substrate, having a first dielectric layer thereon, wherein the first dielectric layer has a trench therein;
    a gate structure, disposed on the substrate in the trench and comprising:
    a work function metal layer, disposed in the trench, and comprising a Ti-containing metal layer and a $TiAl_3$ phase metal layer disposed on the Ti-containing metal layer, wherein the Ti-containing metal layer is a TiAl metal layer, wherein the Ti-containing metal layer has a thickness ranging from 2 nm to 10 nm; and
    a metal layer filling the trench;
    a second dielectric layer, disposed between the gate structure and the substrate; and
    a source/drain region, disposed in the substrate at two sides of the gate structure.

3. The semiconductor device as claimed in claim 1, wherein a thickness of $TiAl_3$ phase metal layer is larger than a thickness of the Al layer.

4. The semiconductor device as claimed in claim 2, wherein a thickness of $TiAl_3$ phase metal layer is larger than a thickness of the Ti-containing metal layer.

* * * * *